(12) United States Patent
Maegawa (10) Patent No.: US 12,136,575 B2
(45) Date of Patent: Nov. 5, 2024

(54) SEMICONDUCTOR PACKAGE (71) Applicant: Mitsubishi Electric Corporation, Tokyo (JP)

(72) Inventor: Tomohiro Maegawa, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 531 days.

(21) Appl. No.: 17/600,786

(22) PCT Filed: Aug. 20, 2019

(86) PCT No.: PCT/JP2019/032474
§ 371 (c)(1),
(2) Date: Oct. 1, 2021

(87) PCT Pub. No.: WO2021/033269
PCT Pub. Date: Feb. 25, 2021

(65) Prior Publication Data
US 2022/0181220 A1   Jun. 9, 2022

(51) Int. Cl.
*H01L 23/10*   (2006.01)
*H01L 23/00*   (2006.01)
*H01L 23/04*   (2006.01)

(52) U.S. Cl.
CPC .............. *H01L 23/10* (2013.01); *H01L 23/04* (2013.01); *H01L 23/562* (2013.01)

(58) Field of Classification Search
CPC . H01L 2924/16315; H01L 2924/16235; H01L 2924/161; H01L 2924/35;
(Continued)

(56) References Cited

U.S. PATENT DOCUMENTS

| | | |
|---|---|---|
| 2002/0140083 A1 | 10/2002 | Matsuda |
| 2004/0080917 A1 | 4/2004 | Steddom et al. |
| 2010/0148341 A1* | 6/2010 | Fuji .......................... H01L 24/11 |
| | | 257/776 |

FOREIGN PATENT DOCUMENTS

| | | |
|---|---|---|
| JP | 2002-289733 A | 10/2002 |
| JP | 2010-261806 A | 11/2010 |

(Continued)

OTHER PUBLICATIONS

International Search Report; Written Opinion; and Notification of Transmittal of the International Search Report and the Written Opinion of the International Searching Authority, or the Declaration issued in PCT/JP2019/032474; mailed Nov. 12, 2019.

(Continued)

*Primary Examiner* — Walter H Swanson
*Assistant Examiner* — Moataz Khalifa
(74) *Attorney, Agent, or Firm* — Studebaker & Brackett PC (57) ABSTRACT

A device (2) is formed on a main surface of a semiconductor substrate (1). A passivation film (5) covers the main surface. A metallized pattern (6) is formed on the passivation film (5) and surrounds the device (2). A sealing metal layer (7) is formed on the metallized pattern (6) and includes a corner portion (10) in a planar view. A lid (8) is bonded to the metallized pattern (6) with the sealing metal layer (7) interposed therebetween and vacuum-seals the device (2). A dummy wiring (11) is softer than the metallized pattern (6), is formed at least between an outer portion of the corner portion of the sealing metal layer (7) and the semiconductor substrate (1), and does not electrically connected to the device (2).

12 Claims, 10 Drawing Sheets

(58) Field of Classification Search
CPC ........... H01L 2924/351; H01L 2924/16; H01L 27/14618; H10K 59/8722
See application file for complete search history.

(56) References Cited

FOREIGN PATENT DOCUMENTS

| | | | |
|---|---|---|---|
| JP | 2017-038227 A | 2/2017 | |
| WO | WO-2016024946 A1 * | 2/2016 | ........... B81B 7/0048 |

OTHER PUBLICATIONS

The extended European search report issued by the European Patent Office on Sep. 12, 2022, which corresponds to European Patent Application No. 19942492.0—1212 and is related to U.S. Appl. No. 17/600,786.

* cited by examiner

SEMICONDUCTOR PACKAGE

FIELD

The present disclosure relates to a semiconductor package.

BACKGROUND

A semiconductor package in which a lid is bonded to a semiconductor substrate with a sealing metal layer interposed therebetween to vacuum-seal a device formed on the semiconductor substrate has been proposed (see, e.g., PTL 1).

CITATION LIST

Patent Literature

[PTL 1] JP 2010-261806 A

SUMMARY

Technical Problem

A material for the semiconductor substrate is Si or the like, and differs from a material for the sealing metal layer in a physical property such as a linear expansion coefficient or a Young's modulus. Accordingly, a stress is generated. Therefore, there has been a problem that the semiconductor substrate is broken, so that a heat cycle resistance decreases.

The present invention has been made to solve the above-described problem, and is directed to obtaining a semiconductor package capable of improving a heat cycle resistance.

Solution to Problem

A semiconductor package according to the present disclosure includes: a semiconductor substrate; a device formed on a main surface of the semiconductor substrate; a passivation film covering the main surface; a metallized pattern formed on the passivation film and surrounding the device; a sealing metal layer formed on the metallized pattern and including a corner portion in a planar view; a lid bonded to the metallized pattern with the sealing metal layer interposed therebetween and vacuum-sealing the device; and a dummy wiring formed at least between an outer portion of the corner portion of the sealing metal layer and the semiconductor substrate, softer than the metallized pattern, and not electrically connected to the device.

Advantageous Effects of Invention

In the present disclosure, the soft dummy wiring is formed at least between the outer portion of the corner portion of the sealing metal layer and the semiconductor substrate. Stress transmission from the sealing metal layer to the semiconductor substrate can be suppressed by the dummy wiring. Accordingly, the semiconductor substrate is prevented from being broken, so that a heat cycle resistance can be improved.

DESCRIPTION OF EMBODIMENTS

A semiconductor package according to Embodiments of the present disclosure will be described with reference to the drawings. The same components will be denoted by the same symbols, and the repeated description thereof may be omitted.

Embodiment 1

Figure 1:
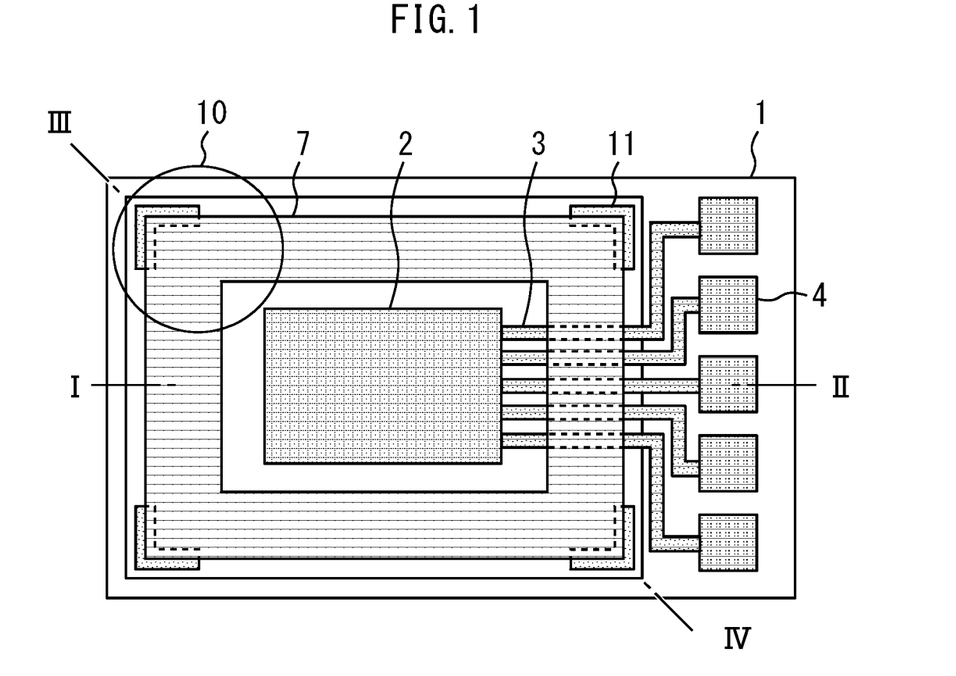
FIG. 1 is a plan view illustrating a semiconductor package according to Embodiment 1.
Figure 2:
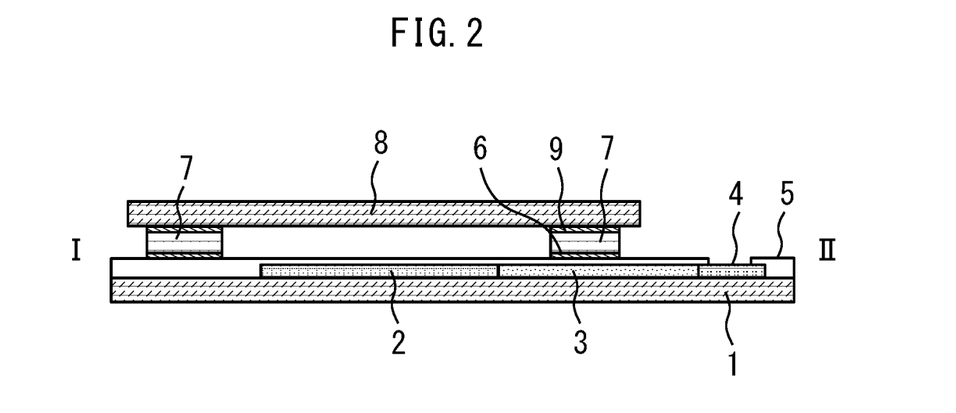
FIG. 2 is a cross-sectional view taken along a line I-II illustrated in FIG. 1.
Figure 3:
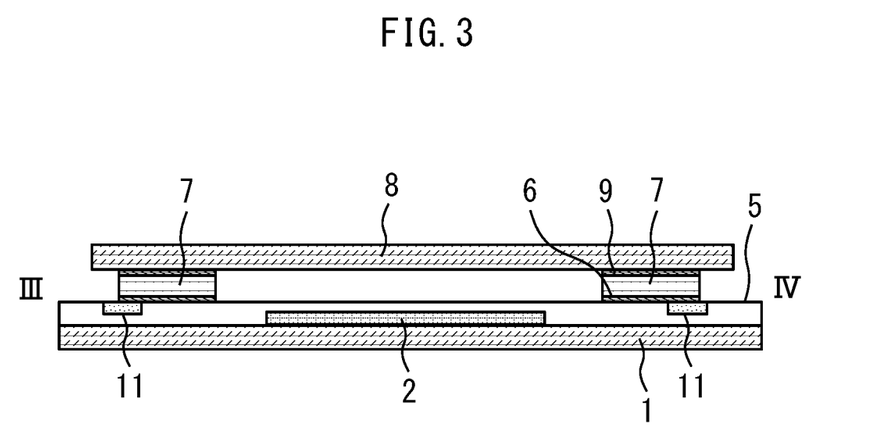
FIG. 3 is a cross-sectional view taken along a line III-IV illustrated in FIG. 1.

FIG. 1 is a plan view illustrating a semiconductor package according to Embodiment 1. FIG. 2 is a cross-sectional view taken along a line I-II illustrated in FIG. 1. FIG. 3 is a cross-sectional view taken along a line III-IV illustrated in FIG. 1. A device 2, a wiring 3, and a pad 4 are formed on a main surface of a semiconductor substrate 1 composed of Si, for example. The device 2 includes a sensor such as an image sensor or a circuit, for example. The pad 4 is connected to the device 2 via the wiring 3. A passivation film 5 composed of SiN or the like is formed on the semiconductor substrate 1 to cover the device 2, the wiring 3, and the pad 4. An opening is formed in the passivation film 5 on the pad 4, so that a central portion on an upper surface of the pad 4 is exposed. Partial or overall processing may be performed for the passivation film 5 on the device 2. If the device 2 includes the image sensor, for example, the device 2 may be inner-lensed by performing partial processing, or may be thinned to increase its transmittance.

A metallized pattern 6 is formed on the passivation film 5 to surround the device 2 in a planar view. A sealing metal layer 7 is formed on the metallized pattern 6. A metallized pattern 9 is formed at a position corresponding to the metallized pattern 6 on the semiconductor substrate 1 side on a lower surface of a lid 8. The metallized pattern 9 on the lid 8 is bonded to the metallized pattern 6 on the semiconductor substrate 1 side with the sealing metal layer 7 interposed therebetween, to vacuum-seal the device 2. For example, the sealing metal layer 7 and the metallized pattern 9 on the lid 8 are overlaid on the metallized pattern 6 and put into a vacuum heating device to be brought into a vacuum state, to perform bonding by heating and melting the sealing metal layer 7.

A hollow portion surrounded by the semiconductor substrate 1, the lid 8, and the sealing metal layer 7 is kept in a vacuum state. When the transverse width of the sealing metal layer 7 is narrowed, the possibility that vacuum breakage occurs without withstanding an effect of a gap generated in the sealing metal layer 7 or a stress generated due to a difference between an inner pressure and an outer pressure increases. Therefore, the transverse width of the sealing metal layer 7 needs to be kept equal to or more than a predetermined value. The pad 4 is formed outside the hollow portion, and is electrically connected to a wiring board or the like (not illustrated). To maintain an inner vacuum, the hollow portion may be provided with a gas adsorbent (getter) or the like. To improve a transmittance for infrared rays, the lid 8 may be provided with an antireflection film (AR). The lid 8 may be subjected to etching processing to keep a vacuum holding volume large, so that an effect of deterioration of a degree of vacuum due to gas emission from a surface of the semiconductor substrate 1 is reduced. If the device 2 includes the image sensor, the lid 8 is provided with an uneven structure having a concavo-convex size equal to or less than a detection wavelength, so that respective refractive indices of air, the lid 8, and a vacuum portion are apparently gradually modulated, and the transmittance can be improved as a result.

The metallized patterns 6 and 9 are each a laminated body obtained by depositing Ti, Cu, Ni, Au, and Pd in any order, for example, and are formed by a sputtering method or a plating method. A material or a formation method is not limited to this, but can be appropriately selected. The sealing metal layer 7 is composed of a solder such as SnAgCu or AuSn. A material for the sealing metal layer 7 is not limited to this, but a material suitable for bonding to the metallized patterns 6 and 9 can be appropriately selected.

The metallized patterns 6 and 9 and the sealing metal layer 7 are each in a square frame shape in a planar view viewed in a direction perpendicular to the main surface of the semiconductor substrate 1. Therefore, the sealing metal layer 7 includes four corner portions 10 in a planar view. A dummy wiring 11 not electrically connected to the device 2 is formed between an outer portion of each of the corner portions 10 of the sealing metal layer 7 and the semiconductor substrate 1. The wiring 3 and the dummy wiring 11 are each composed of AlSi or AlSiCu, for example, and lower in modulus of elasticity, i.e., softer than the metallized patterns 6 and 9.

A stress is generated depending on a difference in a physical property, such as a linear expansion coefficient or a Young's modulus, between a material for the semiconductor substrate 1 and a material for the sealing metal layer 7. The stress is particularly concentrated on the outer portion of the corner portion 10 of the sealing metal layer 7. Unless a shape of the sealing metal layer 7 is a perfect circular shape, the concentration of the stress cannot be eliminated. Even if the corner of the square frame shape of the sealing metal layer 7 is blunted or round, for example, the concentration of the stress cannot be completely eliminated. In the present embodiment, the soft dummy wiring 11 is formed at least between the outer portion of the corner portion 10 of the sealing metal layer 7 and the semiconductor substrate 1. Stress transmission from the sealing metal layer 7 to the semiconductor substrate 1 can be suppressed by the dummy wiring 11. Accordingly, the semiconductor substrate 1 is prevented from being broken, so that a heat cycle resistance can be improved. It is in principle possible to suppress the stress transmission by depositing a soft metal, such as Al, thick as the metallized patterns 6 and 9. In this case, however, a large difference in interlayer stress occurs between the metallized patterns 6 and 9, so that another mode defect such as interlayer peeling or interlayer breakage highly likely occurs, which is not realistic.

The wiring 3 is connected to the pad 4 and the device 2 by bypassing the corner portion 10 of the sealing metal layer 7. When the wiring 3 is arranged to avoid the corner portion 10 of the sealing metal layer 7 on which a stress is concentrated, a malfunction due to disconnection of the wiring 3 can be prevented.

If a material for the lid 8 is Si that is the same as that for the semiconductor substrate 1, there is no difference in a physical property, such as a linear expansion coefficient, between the lid 8 and the semiconductor substrate 1. Accordingly, only the stress due to the difference in the physical property between the lid 8 and the sealing metal layer 7 may be considered. The material for the lid 8 is not limited to Si, but may be glass, Ge, or the like. If the material for the semiconductor substrate 1 and the material for the lid 8 differ from each other, the stress increases due to the difference in the physical property therebetween. Accordingly, suppression of the stress transmission by the dummy wiring 11 is particularly effective.

Embodiment 2

Figure 4:
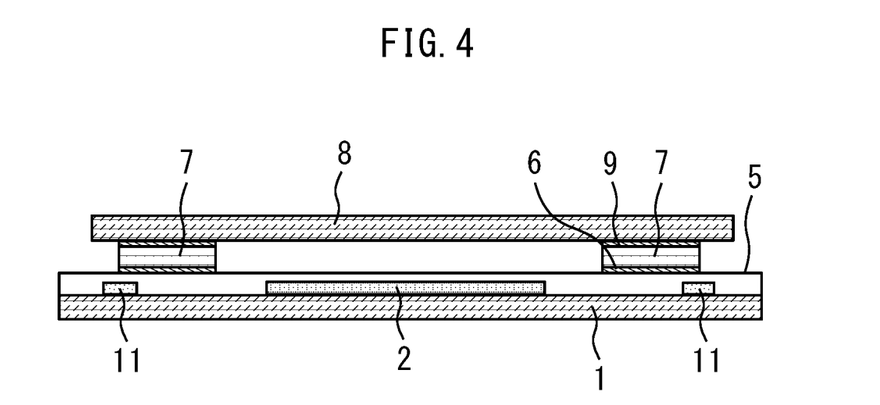
FIG. 4 is a cross-sectional view illustrating a semiconductor package according to Embodiment 2.

FIG. 4 is a cross-sectional view illustrating a semiconductor package according to Embodiment 2. In the present embodiment, a dummy wiring 11 is formed of the same layer as that forming the wiring 3 on a semiconductor substrate 1, and both the dummy wiring 11 and the wiring 3 are the same in thickness and material. In this case, the dummy wiring 11 and the wiring 3 can be simultaneously formed. Accordingly, a manufacturing process need not be added to form the dummy wiring 11. The thickness of a passivation film 5 is generally set to 0.5 μm to several micrometers, and is thus significantly smaller than the thickness of a sealing metal layer 7. Therefore, a configuration according to the present embodiment also makes it possible to obtain a stress transmission suppressing effect in Embodiment 1. Another configuration and effect are similar to those in Embodiment 1.

Embodiment 3

Figure 5:
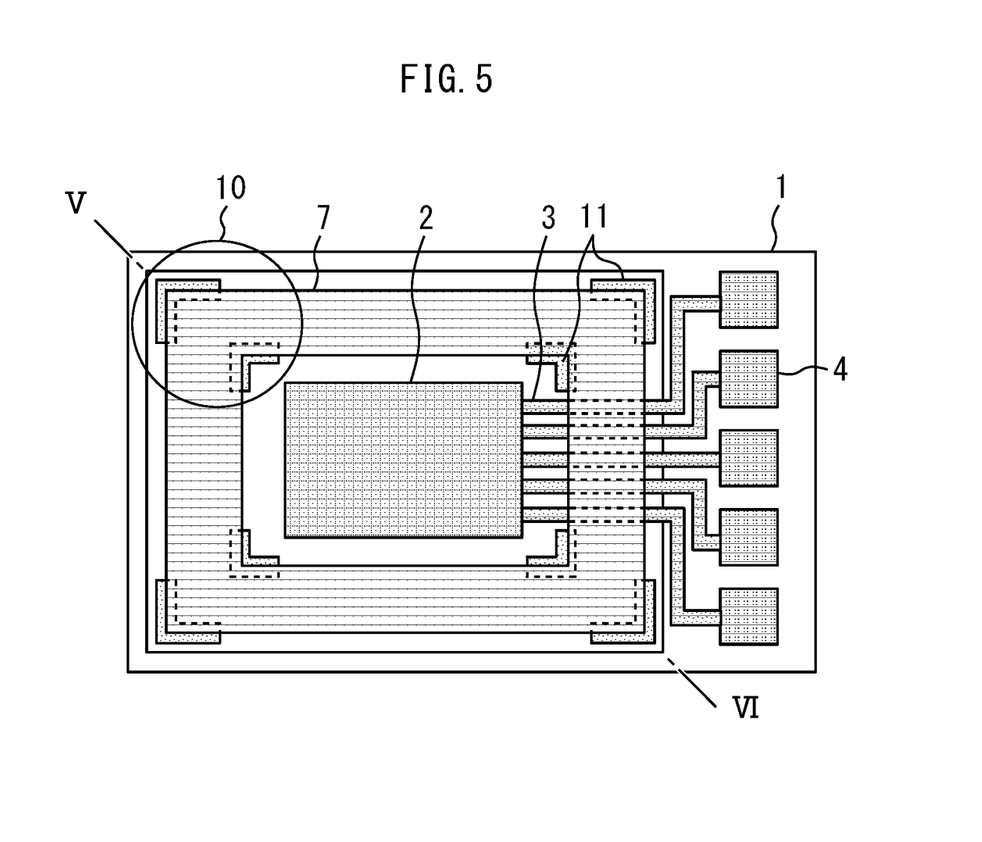
FIG. 5 is a plan view illustrating a semiconductor package according to Embodiment 3.
Figure 6:
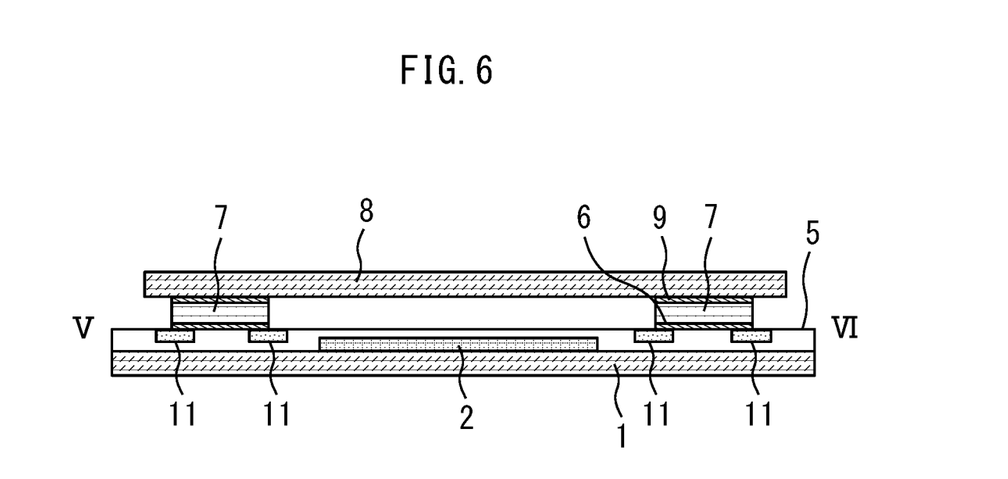
FIG. 6 is a cross-sectional view taken along a line V-VI illustrated in FIG. 5.

FIG. 5 is a plan view illustrating a semiconductor package according to Embodiment 3. FIG. 6 is a cross-sectional view taken along a line V-VI illustrated in FIG. 5. A stress increases in not only an outer portion but also an inner portion of a corner portion 10 of a sealing metal layer 7. In the present embodiment, a dummy wiring 11 is also formed between the inner portion of the corner portion 10 of the sealing metal layer 7 and a semiconductor substrate 1. Stress transmission from the sealing metal layer 7 to the semiconductor substrate 1 can be further suppressed by the dummy wiring 11. Accordingly, a heat cycle resistance can be further improved. Another configuration and effect are similar to those in Embodiment 1.

Embodiment 4

Figure 7:
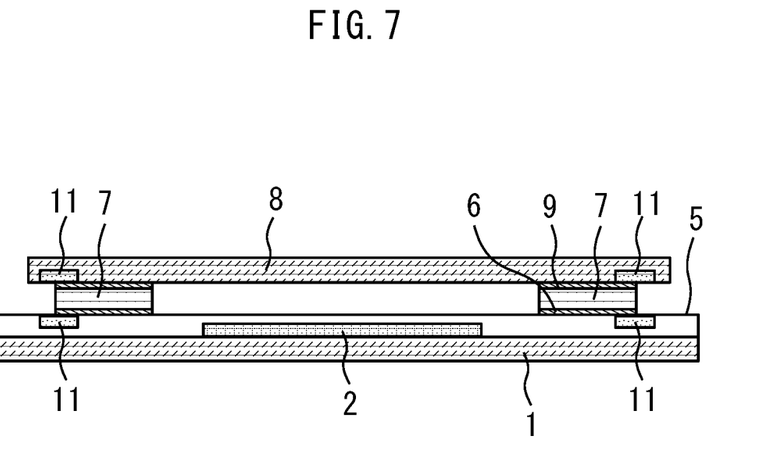
FIG. 7 is a cross-sectional view illustrating a semiconductor package according to Embodiment 4.

FIG. 7 is a cross-sectional view illustrating a semiconductor package according to Embodiment 4. When a lid 8 is broken by a stress, a degree of vacuum in the package deteriorates. In the present embodiment, a dummy wiring 11 is also formed between an outer portion of a corner portion 10 of a sealing metal layer 7 and the lid 8. Stress transmission from the sealing metal layer 7 to the lid 8 can be suppressed by the dummy wiring 11. Accordingly, a stress resistance of the lid 8 is enhanced, so that the reliability of the degree of vacuum can be ensured. Another configuration and effect are similar to those in Embodiment 1. The dummy wiring 11 may be formed between an inner portion of the corner portion 10 of the sealing metal layer 7 and the lid 8.

Embodiment 5

Figure 8:
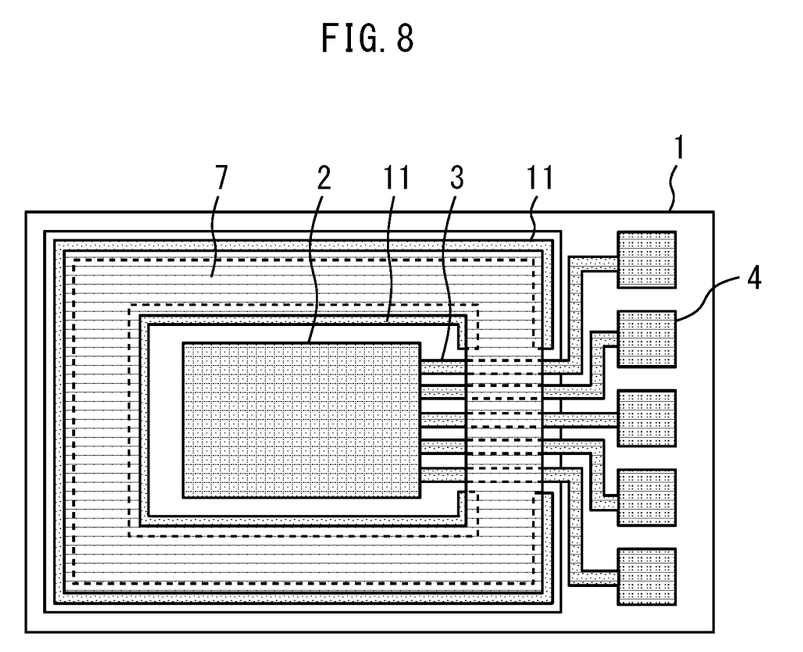
FIG. 8 is a plan view illustrating a semiconductor package according to Embodiment 5.

FIG. 8 is a plan view illustrating a semiconductor package according to Embodiment 5. A dummy wiring 11 is formed between a sealing metal layer 7 and a semiconductor substrate 1, as in Embodiment 1. In the present embodiment, the dummy wiring 11 is provided not only in a corner portion 10 of the sealing metal layer 7 but also along an outer peripheral portion and an inner peripheral portion of the sealing metal layer 7. One side of the sealing metal layer 7 having a square frame shape in a planar view includes a portion where the dummy wiring 11 is not provided. In the portion, a wiring 3 crosses the sealing metal layer 7, to connect a device 2 in the package and a pad 4 provided outside.

Figure 9:
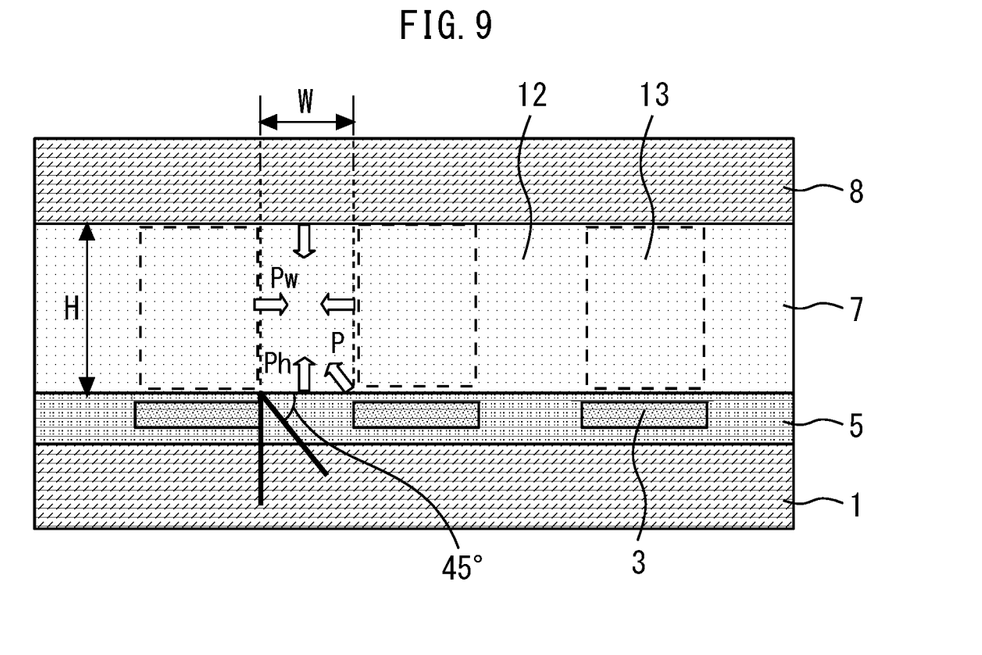
FIG. 9 is a cross-sectional view illustrating, in an enlarged manner, the outer peripheral portion of the sealing metal layer that the wiring illustrated in FIG. 8 crosses.

FIG. 9 is a cross-sectional view illustrating, in an enlarged manner, the outer peripheral portion of the sealing metal layer that the wiring illustrated in FIG. 8 crosses. In the outer peripheral portion and the inner peripheral portion of the sealing metal layer 7, there is a region 12 where neither the wiring 3 nor the dummy wiring 11 exists. In the region 12, a stress is generated due to a difference in a physical property between the semiconductor substrate 1 and the sealing metal layer 7. On the other hand, a region above the wiring 3 or the dummy wiring 11 is a stress relaxation region 13 where a stress is relaxed.

If the sealing metal layer 7 is macroscopically recognized as one member, a stress P to be generated in the sealing metal layer 7 is the sum of vectors of a stress Ph applied in a thickness direction and a stress Pw applied in a width direction of the sealing metal layer 7. Letting W be the width of the region 12 where neither the wiring 3 nor the dummy wiring 11 exists and H be the thickness of the sealing metal layer 7, the stress Ph is proportional to $H^3 \times W$, and the stress Pw is proportional to $W^3 \times H$. Therefore, when the width W of the region 12 is reduced, the stress can be reduced.

The semiconductor substrate 1 is an Si wafer with a plane orientation (100), (110), or (111). In this case, the semiconductor substrate 1 has a crystal structure having cleaved facets, respectively, in a direction perpendicular to and a direction at an angle of 45 degrees to its main surface. Accordingly, the semiconductor substrate 1 is easily broken in the direction perpendicular to and the direction at an angle of 45 degrees to the main surface. Therefore, if a stress vector is shifted in the direction at an angle of 45 degrees to the main surface, the breakage can be reduced. Although a vertical stress causes surface peeling, a peeling resistance of the substrate is generally higher than a breakage resistance. Accordingly, the vertical stress is of less concern.

Figure 10:
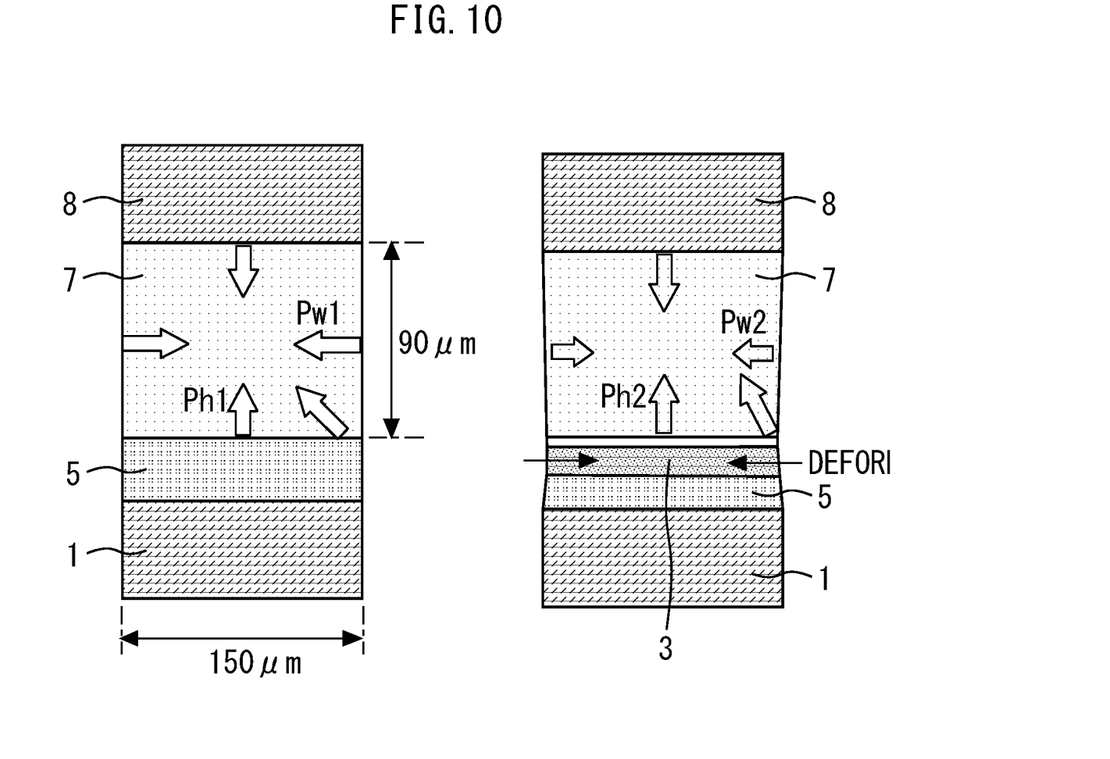
FIG. 10 is a diagram illustrating a strip-shaped model used for a stress simulation.

An effect of the stress relaxation region 13 is quantitatively illustrated. FIG. 10 is a diagram illustrating a strip-shaped model used for a stress simulation. The left of FIG. 10 illustrates a case where the wiring 3 as a stress relaxation layer does not exist, and the right of FIG. 10 illustrates a case where the wiring 3 exists. The width of the region is 150 μm, the thickness of the sealing metal layer 7 is 90 μm, and the thickness of the wiring 3 is 0.8 μm. The wiring 3 is deformed by following a stress generated in the sealing metal layer 7, so that an amount of strain in the sealing metal layer 7 is relaxed. Accordingly, a lateral stress is reduced.

The following table indicates a simulation result. CASE 1 indicates a case where the wiring 3 does not exist. CASE 2 indicates a case where the wiring 3 exists in the entire width direction. CASE 3 indicates a case where the wiring 3 exists in a range of 20 μm in a width of 150 μm.

|  | Stress on the upper surface of the passivation film | Stress on the upper surface of the substrate |
| --- | --- | --- |
| CASE 1 | 1143 MPa | 1143 MPa |
| CASE 2 | 886 MPa | 405 MPa |
| CASE 3 | 1125 MPa | 381 MPa |

In CASE 2 where the wiring 3 exists, it is found that a stress is more relaxed above and below the wiring 3 than that in CASE 1 where the wiring 3 does not exist. In CASE 3, a difference between stress values above and below the wiring 3 is large. Accordingly, disconnection due to a strain may occur.

In CASE 1 where the wiring 3 does not exist, a stress Ph1 in the thickness direction is 360 Mpa, and a stress Pw1 in the width direction is approximately 1050 Mpa. The thickness of the wiring 3 is significantly smaller than the width thereof. Accordingly, in CASE 2 where the wiring 3 exists, a stress Ph2 in the thickness direction is also approximately 360 Mpa, and is almost the same as that in CASE 1. On the other hand, a stress Pw2 in the width direction is significantly reduced to 185 MPa. Therefore, in preventing the semiconductor substrate 1 from being broken, the stress relaxation region 13 where the wiring 3 or the dummy wiring 11 exists need not be considered, but a W/H ratio in the region 12 where neither the wiring 3 nor the dummy wiring 11 exists needs to be controlled.

Figure 11:
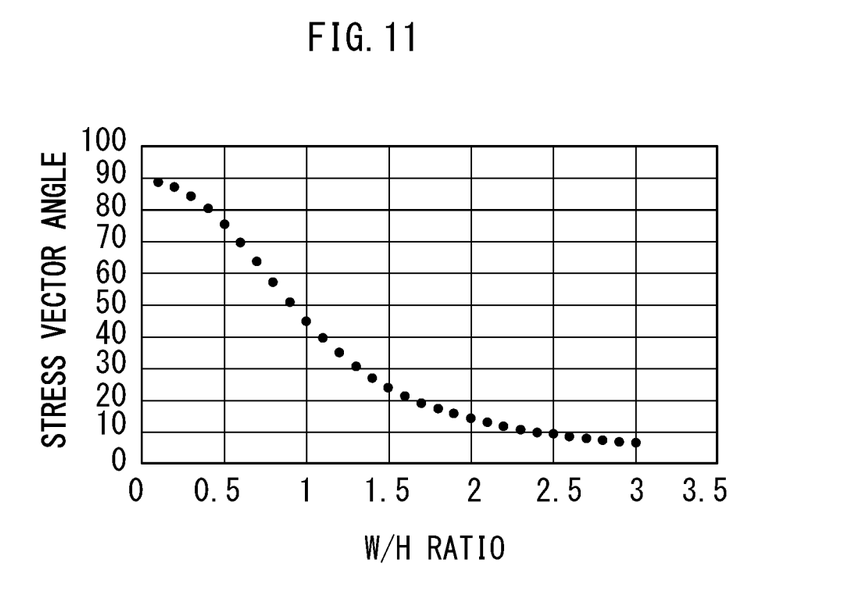
FIG. 11 is a diagram illustrating a relationship between a W/H ratio and a stress vector angle.
Figure 12:
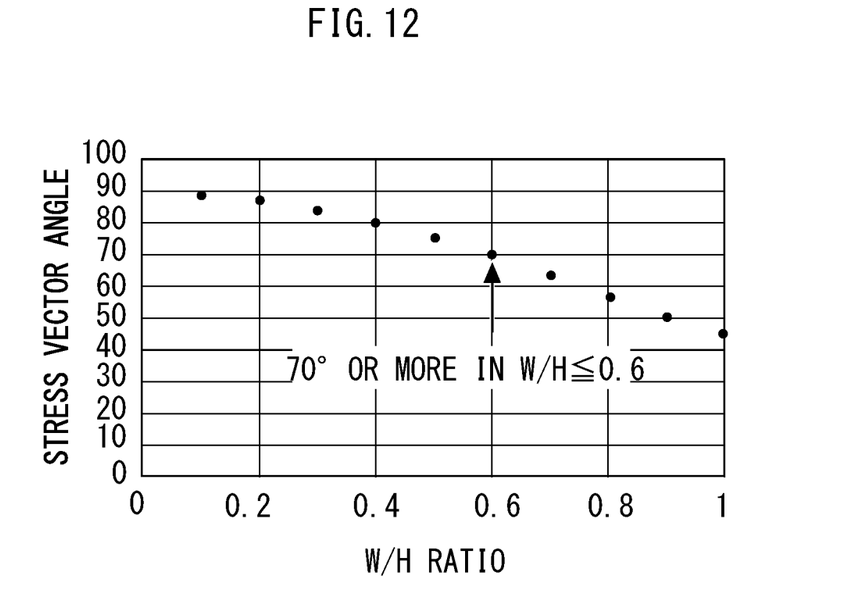
FIG. 12 is a diagram illustrating, in an enlarged manner, a part of FIG. 11.

FIG. 11 is a diagram illustrating a relationship between a W/H ratio and a stress vector angle. FIG. 12 is a diagram illustrating, in an enlarged manner, a part of FIG. 11. The stress vector angle represents an angle of a stress vector to the main surface of the semiconductor substrate 1. It is found that in W/H≤0.6, the stress vector angle can be set to 70 degrees or more. That is, the stress vector can be shifted from the direction at the angle of 45 degrees at which the semiconductor substrate 1 is easily broken. Although the Si wafer with the plane orientation (100), (110), or (111) is used in the present embodiment, a substrate that differs from the Si wafer in plane orientation, i.e., has a cleaved facet at an angle other than 45 degrees, such as an SiC wafer or a GaN wafer, may be used. In this case, when the stress vector angle is also shifted from the angle of the cleaved facet, a similar effect can be obtained. Even when the substrate is used, the vertical stress is of less concern because the peeling resistance of the substrate is higher than the breakage resistance, as described above. Therefore, the vector is preferably kept at an angle of 70 degrees or more to improve a crack resistance.

Figure 13:
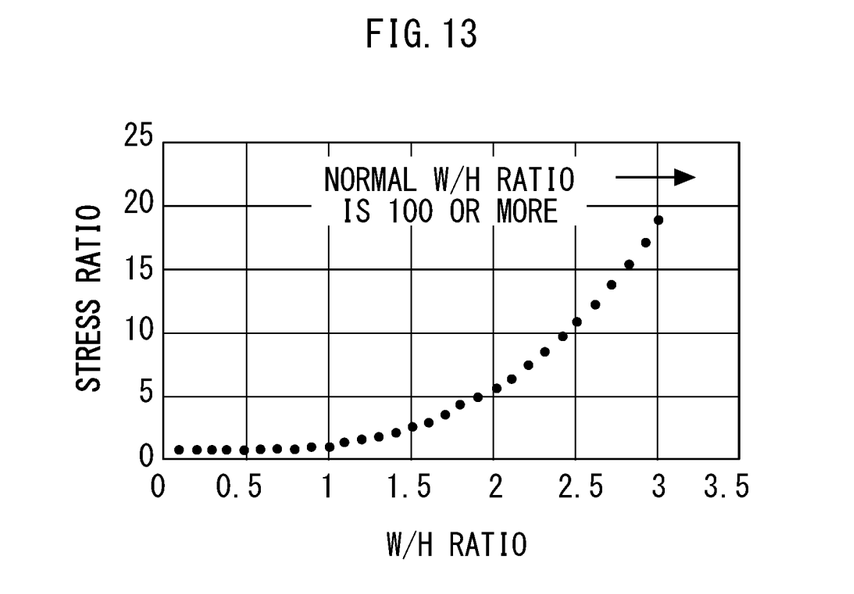
FIG. 13 is a diagram illustrating a relationship between a W/H ratio and a stress ratio.
Figure 14:
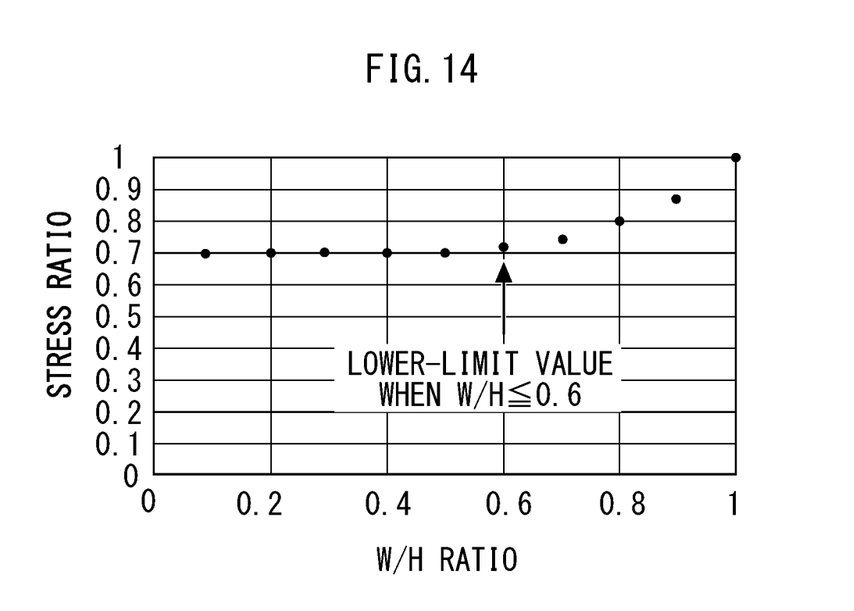
FIG. 14 is a diagram illustrating, in an enlarged manner, a part of FIG. 13.

FIG. 13 is a diagram illustrating a relationship between a W/H ratio and a stress ratio. FIG. 14 is a diagram illustrating, in an enlarged manner, a part of FIG. 13. The stress ratio is a magnitude of a stress standardized based on a case where the W/H ratio is 1. It is found that when W/H≤0.6, the stress can be reduced to the vicinity of a lower-limit value.

Based on the above-described result, in the present embodiment, the width W of the region 12 where neither the wiring 3 nor the dummy wiring 11 exists in the outer peripheral portion and the inner peripheral portion of the sealing metal layer 7 is set to 0.6 times or less the thickness H of the sealing metal layer 7 (W/H≤0.6). As a result, the breakage of the semiconductor substrate 1 can be reduced. If a plurality of regions 12 exist, all the regions most preferably satisfy W/H≤0.6. The dummy wiring 11 may be provided to satisfy the above-described relational expression particularly for only a point on which the stress is concentrated.

Practically, the thickness H of the sealing metal layer 7 is set to approximately 40 to 100 μm. It is significantly difficult to deposit the sealing metal layer 7 having a thickness equal to or more than this thickness using a method such as evaporation, sputtering, or dispensing, resulting in an increase in cost. Therefore, the width W of the region 12 needs to be set to 25 to 60 μm.

Embodiment 6

Figure 15:
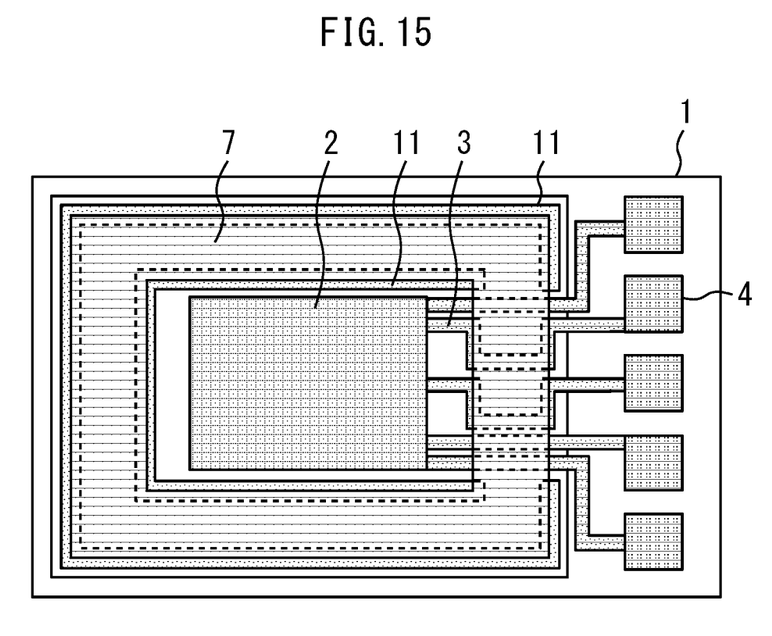
FIG. 15 is a plan view illustrating a semiconductor package according to Embodiment 6.

FIG. 15 is a plan view illustrating a semiconductor package according to Embodiment 6. In an outer peripheral portion and an inner peripheral portion of a sealing metal layer 7, a wiring 3 extends along an outer periphery or an inner periphery of the sealing metal layer 7. Accordingly, when a width is measured along the outer periphery or the inner periphery of the sealing metal layer 7, the width of the wiring 3 in the outer peripheral portion and the inner peripheral portion of the sealing metal layer 7 is wider than the width of the wiring 3 in a central portion of the sealing metal layer 7.

When the width of the wiring 3 in the outer peripheral portion and the inner peripheral portion of the sealing metal layer 7 on which a stress is concentrated is thus widened, the wiring 3 that crosses the sealing metal layer 7 can be prevented from being disconnected. It is generally known that if the wiring 3 is arranged too thick, there occurs a malfunction, in which the reliability of the wiring deteriorates, called sliding destruction due to a difference in stress between the wiring 3 and the semiconductor substrate 1 or a passivation film 5. Accordingly, the width of the wiring 3 is generally set to 100 μm or less. When a countermeasure according to the present embodiment is taken, the width of the wiring 3 in the central portion of the sealing metal layer 7 can be narrowed. As a result, the sliding destruction occurring due to a stress relationship between the wiring 3 and the passivation film 5 can be suppressed.

Embodiment 7

Figure 16:
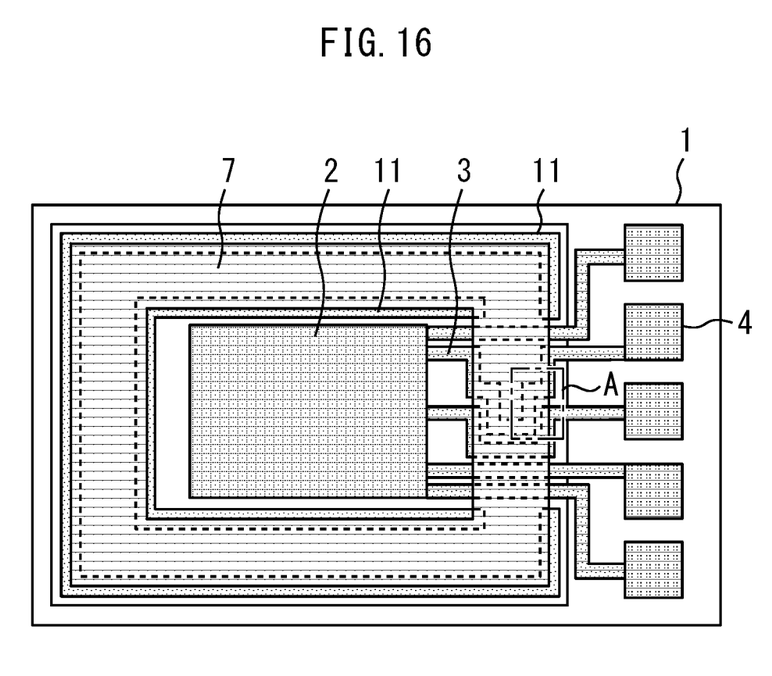
FIG. 16 is a plan view illustrating a semiconductor package according to Embodiment 7.
Figure 17:
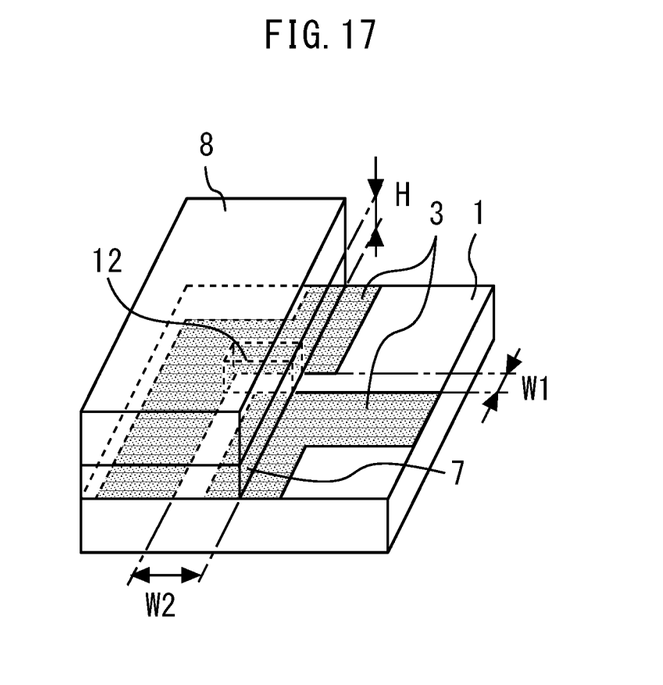
FIG. 17 is a perspective view illustrating, in an enlarged manner, a region A illustrated in FIG. 16.

FIG. 16 is a plan view illustrating a semiconductor package according to Embodiment 7. FIG. 17 is a perspective view illustrating, in an enlarged manner, a region A illustrated in FIG. 16. The width of a region 12 where a plurality of wirings 3 do not exist includes a first width W1 along an outer periphery or an inner periphery of a sealing metal layer 7 and a second width W2 in a direction perpendicular to the outer periphery or the inner periphery of the sealing metal layer 7. Both the first width W1 and the second width W2 are 0.6 times or less a thickness H of the sealing metal layer 7 (W1, W2≤0.6×H). As a result, a stress can be more relaxed than that in a case where only the first width W1 is 0.6 times or less the thickness H of the sealing metal layer 7.

Embodiment 8

Figure 18:
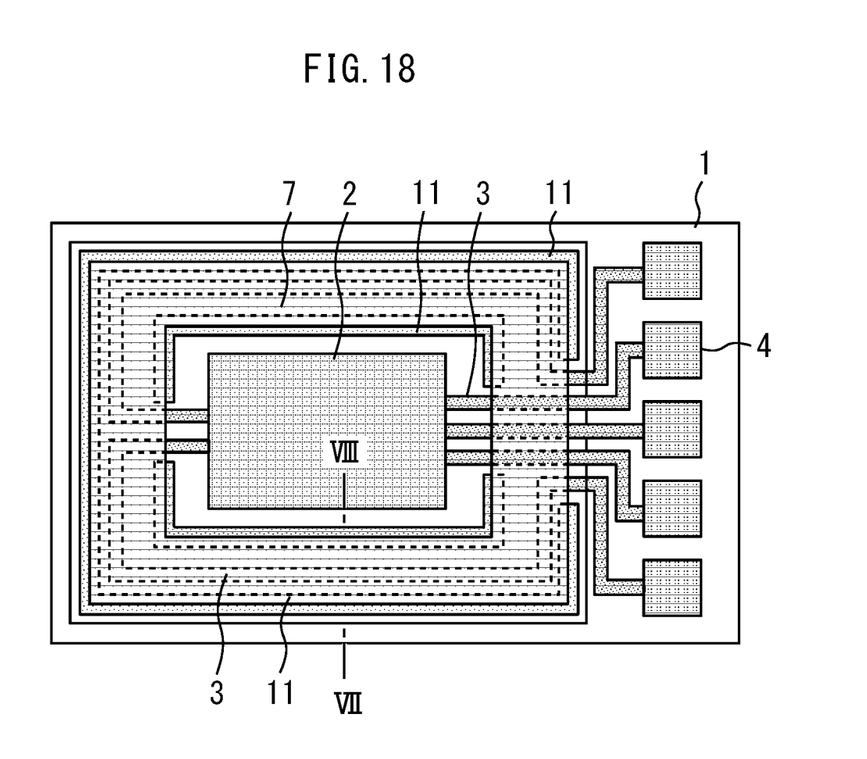
FIG. 18 is a plan view illustrating a semiconductor package according to Embodiment 8.
Figure 19:
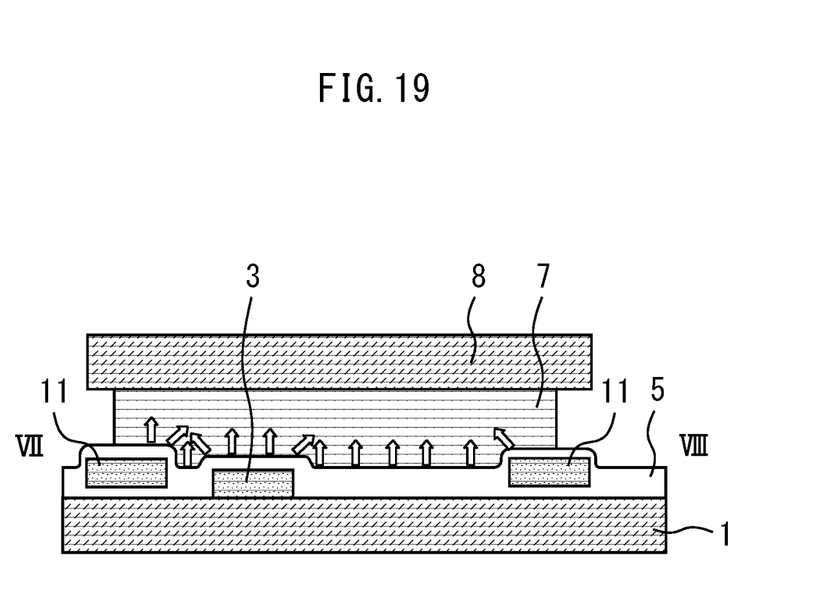
FIG. 19 is a cross-sectional view taken along a line VII-VIII illustrated in FIG. 18.

FIG. 18 is a plan view illustrating a semiconductor package according to Embodiment 8. A wiring 3 and a dummy wiring 11 are arranged parallel to each other along an outer periphery of a sealing metal layer 7 in an outer peripheral portion of the sealing metal layer 7. FIG. 19 is a cross-sectional view taken along a line VII-VIII illustrated in FIG. 18. An arrow in the drawing represents a tensile stress vector. The stress vector is dispersed by a step structure between the wiring 3 and the dummy wiring 11 arranged parallel to each other, so that a stress is relaxed. Accordingly, a heat cycle resistance can be improved by preventing the semiconductor substrate 1 from being broken. Wettability at the time of thermal melting of the sealing metal layer 7 can be improved. Accordingly, occurrence of a leak between a hollow portion and the outside can be suppressed. The sealing metal layer 7 can be prevented from protruding at the time of thermal melting.

When the respective widths of the wiring 3 and the dummy wiring 11 are set to 100 μm or less, sliding destruction occurring by a stress relationship between the wiring 3 or the dummy wiring 11 and a passivation film 5 can be suppressed. Another configuration and effect are similar to those in Embodiment 5.

REFERENCE SIGNS LIST 1 semiconductor substrate; 2 device; 3 wiring; 5 passivation film; 6 metallized pattern; 7 sealing metal layer; 8 lid; 10 corner portion; 11 dummy wiring; 12 region

The invention claimed is:
1. A semiconductor package comprising:
a semiconductor substrate;
a device formed on a main surface of the semiconductor substrate;
a passivation film covering the main surface;
a metallized pattern formed on the passivation film and surrounding the device;
a sealing metal layer formed on the metallized pattern and including a corner portion in a planar view;
a lid bonded to the metallized pattern with the sealing metal layer interposed therebetween and vacuum-sealing the device;
a dummy wiring formed at least between an outer portion of the corner portion of the sealing metal layer and the semiconductor substrate, softer than the metallized pattern, and not electrically connected to the device; and
a wiring formed on the main surface of the semiconductor substrate to extend under the sealing metal and electrically connect to the device, wherein
the dummy wiring does not intersect with the wiring in a plan view.
2. The semiconductor package according to claim 1, wherein the wiring is arranged to avoid the corner portion of the sealing metal layer.

3. The semiconductor package according to claim 2, wherein the dummy wiring is formed of the same layer as that forming the wiring.

4. The semiconductor package according to claim 1, wherein a material for the semiconductor substrate is different from a material for the lid.

5. The semiconductor package according to claim 1, wherein the dummy wiring is formed between an inner portion of the corner portion of the sealing metal layer and the semiconductor substrate.

6. The semiconductor package according to claim 1, wherein the dummy wiring is formed between the outer portion of the corner portion of the sealing metal layer and the lid.

7. A semiconductor package comprising:
a semiconductor substrate;
a device formed on a main surface of the semiconductor substrate;
a plurality of wirings formed on the main surface of the semiconductor substrate;
a passivation film covering the main surface and the plurality of wirings;
a metallized pattern formed on the passivation film and surrounding the device;
a sealing metal layer formed on the metallized pattern; and
a lid bonded to the metallized pattern with the sealing metal layer interposed therebetween and vacuum-sealing the device,
wherein the plurality of wirings are softer than the metallized pattern, and
a width of a region where the plurality of wirings does not exist in an outer peripheral portion and an inner peripheral portion of the sealing metal layer is 0.6 times or less a thickness of the sealing metal layer.

8. The semiconductor package according to claim 7, wherein the semiconductor substrate has a crystal structure having a cleaved facet in a direction at an angle of 45 degrees to the main surface.

9. The semiconductor package according to claim 7, wherein a width of the wiring in the outer peripheral portion and the inner peripheral portion of the sealing metal layer is wider than a width of the wiring in a central portion of the sealing metal layer.

10. The semiconductor package according to claim 7, wherein a width of the region includes a first width along an outer periphery or an inner periphery of the sealing metal layer and a second width in a direction perpendicular to the outer periphery or the inner periphery of the sealing metal layer, and
both the first width and the second width are 0.6 times or less a thickness of the sealing metal layer.

11. A semiconductor package comprising:
a semiconductor substrate;
a device formed on a main surface of the semiconductor substrate;
a plurality of wirings including a wiring connected to the device and a dummy wiring not connected to the device formed on the main surface of the semiconductor substrate and;
a passivation film covering the main surface and the plurality of wirings;
a metallized pattern formed on the passivation film and surrounding the device;
a sealing metal layer formed on the metallized pattern; and
a lid bonded to the metallized pattern with the sealing metal layer interposed therebetween and vacuum-sealing the device,
wherein the plurality of wirings are arranged parallel to each other and positioned to extend alongside an outer periphery of the sealing metal layer in an outer peripheral portion of the sealing metal layer.

12. The semiconductor package according to claim 11, wherein a width of each of the plurality of wirings is 100 μm or less.

* * * * *